United States Patent [19]
Petty et al.

[11] Patent Number: 5,424,492
[45] Date of Patent: Jun. 13, 1995

[54] OPTIMAL PCB ROUTING METHODOLOGY FOR HIGH I/O DENSITY INTERCONNECT DEVICES

[75] Inventors: Robert B. Petty; Michael D. Ohlinger; Deepak N. Swamy, all of Austin; Joseph Mallory, Cedar Park, all of Tex.

[73] Assignee: Dell USA, L.P., Austin, Tex.

[21] Appl. No.: 178,078

[22] Filed: Jan. 6, 1994

[51] Int. Cl.[6] ............................................. H05K 1/00
[52] U.S. Cl. ................................... 174/250; 174/254; 174/261; 174/262; 361/760; 361/767; 361/777
[58] Field of Search ............... 174/250, 254, 259, 261, 174/262, 263, 264, 265, 266; 361/760, 767, 777, 784, 792, 794, 813

[56] References Cited

U.S. PATENT DOCUMENTS 4,774,635  9/1988  Greenberg et al. .
5,136,471  8/1992  Inasaka .
5,280,414  1/1994  Davis et al. .
5,304,743  4/1994  Sen et al. .

*Primary Examiner*—Leo P. Picard
*Assistant Examiner*—Cheryl R. Figlin
*Attorney, Agent, or Firm*—Jeff Hood; Robert Wilder; James Huffman

[57] ABSTRACT

An optimal routing methodology for routing high I/O density packages which minimizes the number of PCB layers required. One feature of this routing methodology comprises treating respective I/O that are routed at the top layer of the package as surface mount technology (SMT) pads without dropping vias within the BGA grid, as is commonplace in the industry. This facilitates the use of fewer escapes and allows for more efficient use of the available space. Signal lines on the top layer of the package which must be routed to other layers of the PCB are connected to vias outside of the area of local high signal density on the printed circuit board. The placement of vias outside the area of local high density, i.e., in a depopulated area, reduces the number of layers necessary in the PCB to properly route the signals. This placement also facilitates the use of filtering capacitors to meet EMI requirements. In addition, all voltage pins are placed on the innermost or outermost grids and have clearanced vias. The device is also preferably placed at the beginning or at the end of the bus to maximize the routing efficiency.

12 Claims, 7 Drawing Sheets

OPTIMAL PCB ROUTING METHODOLOGY FOR HIGH I/O DENSITY INTERCONNECT DEVICES

FIELD OF THE INVENTION

The present invention relates to signal routing in printed circuit boards, and more particularly to an optimal routing methodology for high I/O density packages which minimizes the number of layers required in the PCB.

DESCRIPTION OF THE RELATED ART

There currently exist several different methods for packaging semiconductor devices. One popular type of semiconductor packaging is referred to as a quad flat pack (QFP), which is a type of a peripheral lead package. Other types of packaging technologies are referred to as wire bonding, flip chip attachment, and tape automated bonding (TAB), among others.

A new type of packaging technology is referred to as the ball grid array (BGA). The ball grid array was introduced by International Business Machines Corp. (IBM) and includes a number of benefits, including small size, good yields, better electrical performance, and lower profiles, among others. As shown in FIG. 1, BGA packaging comprises placing a semiconductor die on a ball grid array carrier which in turn includes a plurality of solder balls for connecting to solder on a circuit board. Ball grid arrays are basically pin grid arrays (PGAs) with solder balls replacing the pins to permit surface mounting. One of the primary benefits of BGA packaging is the increased lead density. FIG. 2 illustrates a comparison of wire bond, flip chip, and ball grid array packages. As shown, BGAs place contacts over the entire surface of the chip, instead of just around the edges. Thus, BGA packages allow system designers to place more leads in a given package size using looser tolerances than peripheral lead type packages such as the quad flat pack. Therefore, board producers are not required to use the fine pitch spacings that are now necessary for high lead count packages. Also, BGAs can have finer pitch spacings than pin grid arrays, since the solder balls do not have the coplanarity problems associated with through-hole PGAs. For more information on BGA packages, please see "IBM details its ball-grid array push," *Electronic Engineering Times*, Aug. 9, 1993 and "Ball Grid arrays: the hot new package," *Electronic Engineering Times*, Mar. 15, 1993.

With the introduction of high I/O density packages such as the ball grid array, a high priority has been placed on optimal signal routing in the secondary level of packaging in which these devices are placed. Secondary level packaging refers to the printed circuit board (PCB) or primed wiring board (PWB) on which semiconductor devices are mounted. In current applications, a high local I/O density typically results in additional layers of second level package and thus additional cost to the printed circuit board. For example, in the above-referenced article "Ball Grid Arrays: The Hot New Package," a source is quoted as saying that "area-wise, BGAs take less space, but routing traces to them tends to increase your layer count. That can drive cost up, since cost is more a function of layer count than the x and y dimension of the board." One reason additional layers are necessary is that designers typically drop vias in the second level package for all of the I/O ball grids in the ball grid array. Further, the traditional method has been to drop required vias immediately proximate to the respective I/O connections or attach pads that are desired to be connected, these vias being referred to as offset vias. Due to the high I/O density of new packages such as the ball grid array, this method of dropping offset vias immediately proximate to the attach pads has required an increase in the layer count to properly route the necessary signals. For example, on a BGA or similar package having greater than 300 I/O balls or grids on a 50 mil grid, typically three or more PCB layers are required to route the signal lines to the I/O on the grid. This increase in layer count increases the cost of the package. Therefore, a method and apparatus is desired for optimal signal routing in second level packages to reduce the layer count required to route signals for high I/O density first level packages.

SUMMARY OF THE INVENTION

The present invention comprises an optimal routing methodology for routing signals for high I/O density packages which minimizes the number of layers required in the second level package. The second level package includes one or more mounting pads or package footprints for receiving respective high I/O density packages, such as a ball grid array package. Each mounting pad in turn includes a plurality of I/O connectors or attach pads which connect to respective I/O on the BGA package. One feature of the routing methodology of the present invention comprises treating a first plurality of respective I/O connectors or attach pads as surface mount technology (SMT) pads without dropping vias within the BGA grid, as is commonplace in the industry. This facilitates the use of fewer escapes and allows for more efficient use of the available space. Signal lines on the top layer of the package which must be routed to other layers of the PCB are connected to vias located outside of the area of local high density on the printed circuit board. The placement of vias outside of the area of local high density, i.e., in a depopulated area of the board, allows for more efficient use of the available space for signal routing and thus reduces the number of layers necessary in the PCB to properly route the signals. This placement also provides more space between the vias which facilitates in-circuit testing of the assembly as well as the use of filtering capacitors to meet EMI requirements. In addition, voltage and ground pads have clearanced vias and are preferably centralized on the innermost or outermost portion of the mounting pad to reduce the number of vias required. The device is also preferably placed at the beginning or at the end of the bus to maximize the routing efficiency. The present invention further includes a method for creating a PCB with improved signal routing that includes steps of creating the mounting pad on the circuit board, creating vias in a depopulated area of the board, and routing signals from the mounting pad to the vias located in the depopulated area of the board.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
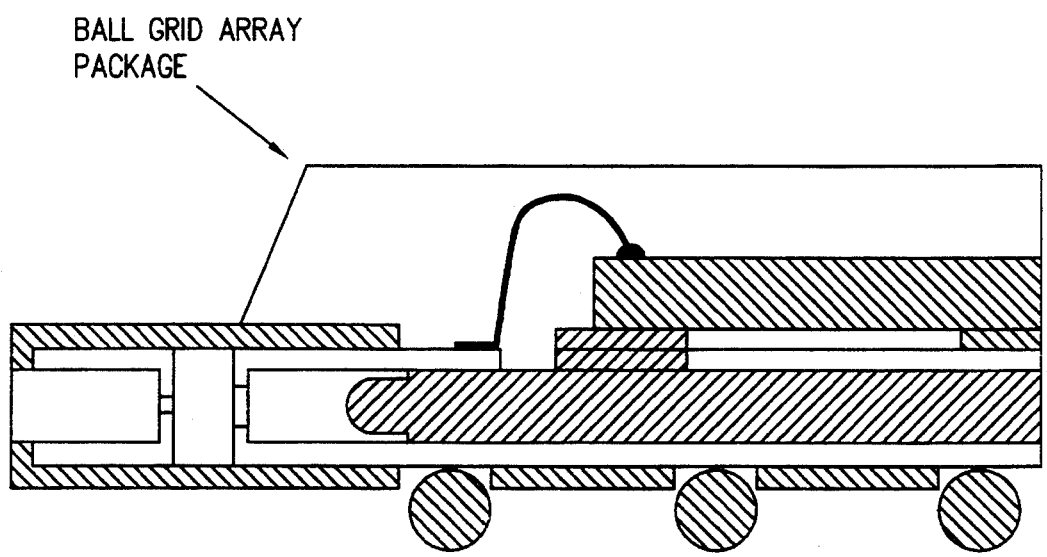
FIG. 1 is a prior art diagram illustrating a ball grid array package.
Figure 2:
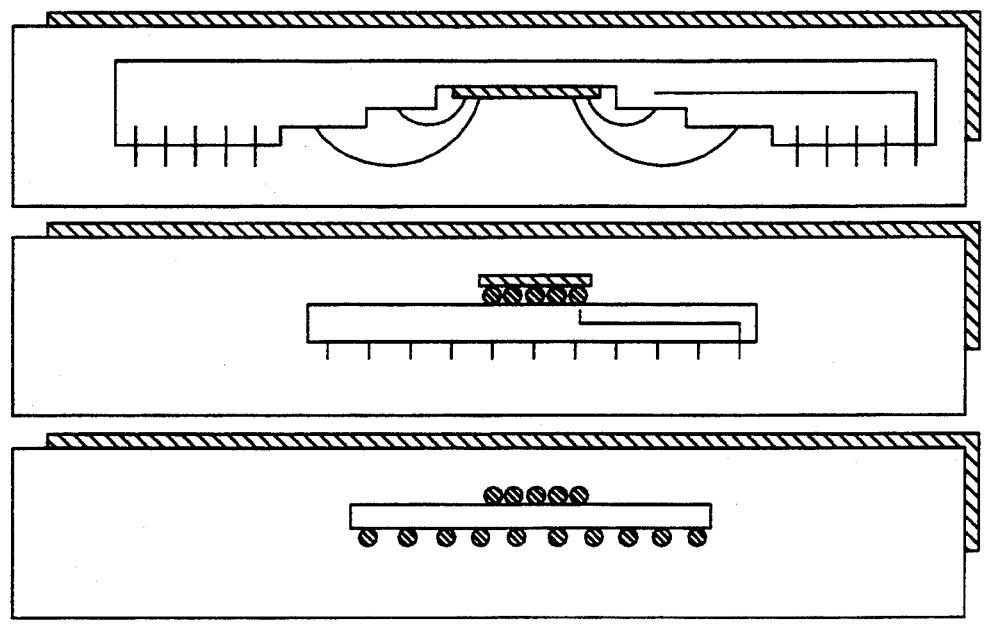
FIG. 2 is a prior art diagram illustrating various packaging technologies including wire bond, flip chip and ball grid array.
Figure 3:
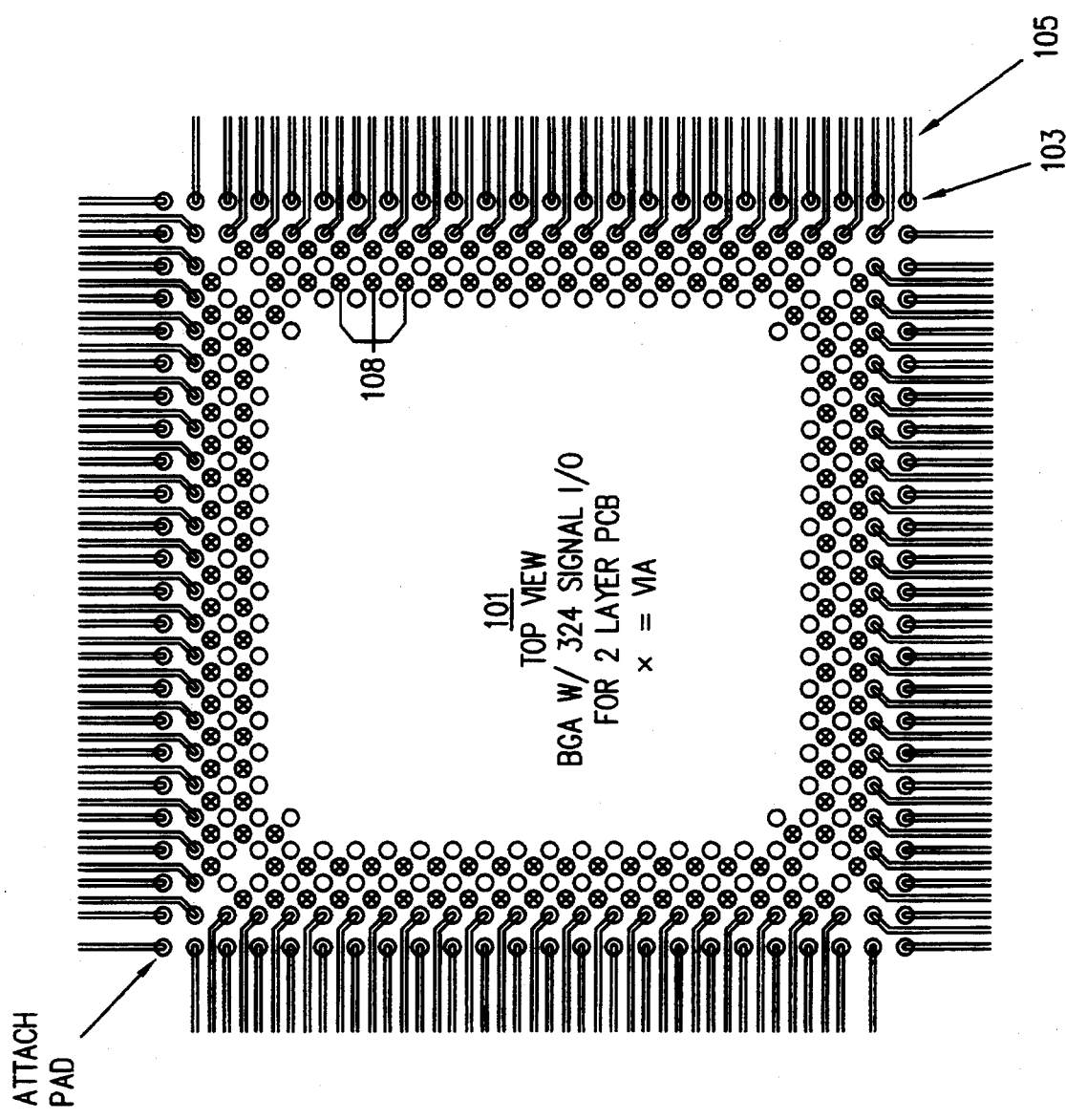
FIG. 3 is a top view of a PCB mounting pad for a high I/O density package using a signal routing methodology according to the present invention.
Figure 4:
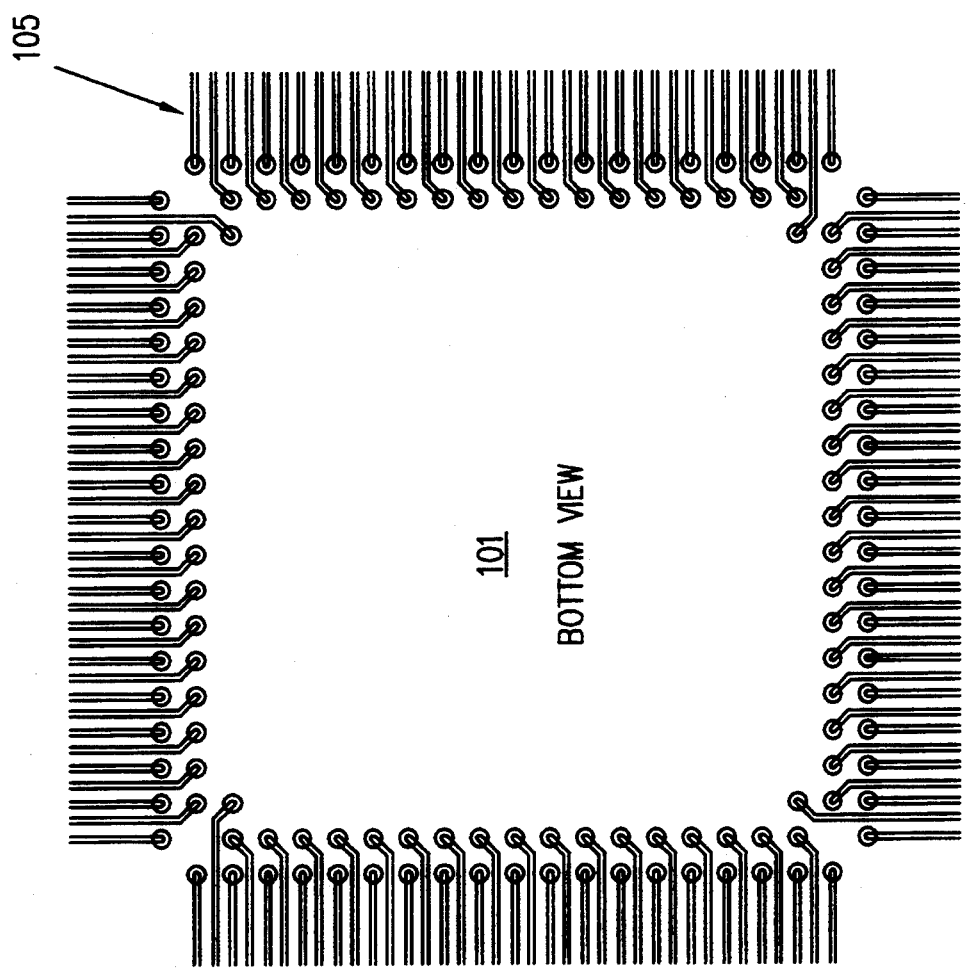
FIG. 4 is a bottom view of the PCB illustrated in FIG. 3.

Referring now to FIGS. 3 and 4, top and bottom views of a PCB mounting pad or package footprint for a high I/O density package is shown. The PCB mounting pad 101 illustrated in FIGS. 3 and 4 includes a plurality of I/O connections or attach pads 103 and uses a routing methodology implemented in the present example with the placement of signal lines or traces 105 according to the present invention. The signal lines or traces 105 each terminate at one end thereof in corresponding attach pads 103. In the embodiment illustrated in FIGS. 3 and 4, the mounting pad 101 is constructed to receive a ball grid array package with 324 signal I/O pads or pins. As shown in FIG. 3, the present invention utilizes a routing methodology whereby a first plurality of the I/O connections or attach pads are configured as surface mount technology (SMT) pads. Configuring a first plurality of attach pads as SMT pads facilitates fewer escapes and allows for a more efficient use of available space. Signal lines 105 on the top layer that must connect to other devices on the top layer of the PCB are simply routed to the other device. Signal lines such as those shown generally at 107 in FIG. 5, which must connect to another layer of the PCB are connected to vias as generally shown at 109 which are located outside of the area of local high signal density. As is known in the art, vias provide electrical connections from one plane or layer of a circuit board to another. In other words, among the first plurality of attach pads 103 which are configured as SMT pads, the corresponding signals which must be routed to other layers of the PCB are routed to a depopulated area of the PCB where the corresponding vias 109 are located. In the present disclosure, a depopulated area of the board is defined as an area with a low signal density relative to other areas of the board.

As discussed in the background section, the prior art method comprised dropping offset vias directly within the BGA grid for all of the attach pads on the mounting pad. The use of offset vias for every attach pad required additional layers in the PCB to route the various signals because of the resulting signal density. According to the present invention, instead of dropping vias within the most populated portion of the package, for example, the terminal area 106, the attach pads on the top layer are configured as SMT pads, and the respective vias are not located in this dense portion of the PCB. Instead, the vias necessary for these top layer attach pads are placed in a less populated area for example the remote via area 110. As shown in FIG. 3, as many top layer attach pads as possible are configured as SMT pads with traces or signal lines 105 routed away from the package to less populated areas of the board. The remaining attach pads cannot be routed to other areas of the board due to the lack of available space for traces. These remaining attach pads include proximate offset vias as shown generally by the circled "x" 108 next to the respective attach pad.

FIG. 4 illustrates the bottom layer of the two-layer PCB whose top layer is illustrated in FIG. 3. As shown, the proximate 108 offset vias illustrated in the top view of FIG. 3 correspond to respective connection points 112 in FIG. 4 with signal lines 105 being routed away from the vias as shown. In other words, FIG. 4 illustrates the vias in the second or bottom layer which were created for the attach pads in the first layer that could not be configured as SMT pads.

Voltage and ground pads are preferably concentrated at the innermost or outermost portion of the mounting pad and preferably have clearanced vias, i.e., vias that pass all the way through the board. By concentrating voltage and ground pads at a certain location in the mounting pad, these respective pads can share one or more common vias, thus reducing the number of vias required. Also, placing the voltage vias at the innermost or outermost B portions of the grid facilitates the use of filtering capacitors to meet electromagnetic interference (EMI) requirements. In addition, the device is preferably placed at the beginning or at the end of a bus to maximize the routing efficiency. It is also noted that since the PCB is configured as only a double sided board, no separate ground layer is included. Therefore, impedance concerns and signal noise concerns are preferably addressed by providing ground strips between the signals, as is known in the art. It is further noted that the routing methodology of the present invention facilitates in-circuit testing of the assembly. Since many of the vias are placed in less populated areas of the board, a greater spacing between the vias is possible, which allows easier testing of the board. Further, the placement of vias in less populated areas and the resultant greater spacing facilitates the use of filtering capacitors in the PCB to meet EMI requirements.

The mounting pad illustrated in FIGS. 3 and 4 includes 7 mil lines and 6 mil spaces and only one line per channel, which are features that result in a low cost PCB that is commonplace in the industry. Using the signal routing methodology according to the present invention, a BGA package with over 300 signal I/O pads can be mounted on a two-layer printed circuit board, whereas prior art methods would have required a four layer board to route the same number of signals. It is further noted that a double sided PCB using the routing methodology according to the present invention can have sufficient signal routing for a package having up to 390 I/O pads while using ground strips between the layers as discussed above.

Figure 5:
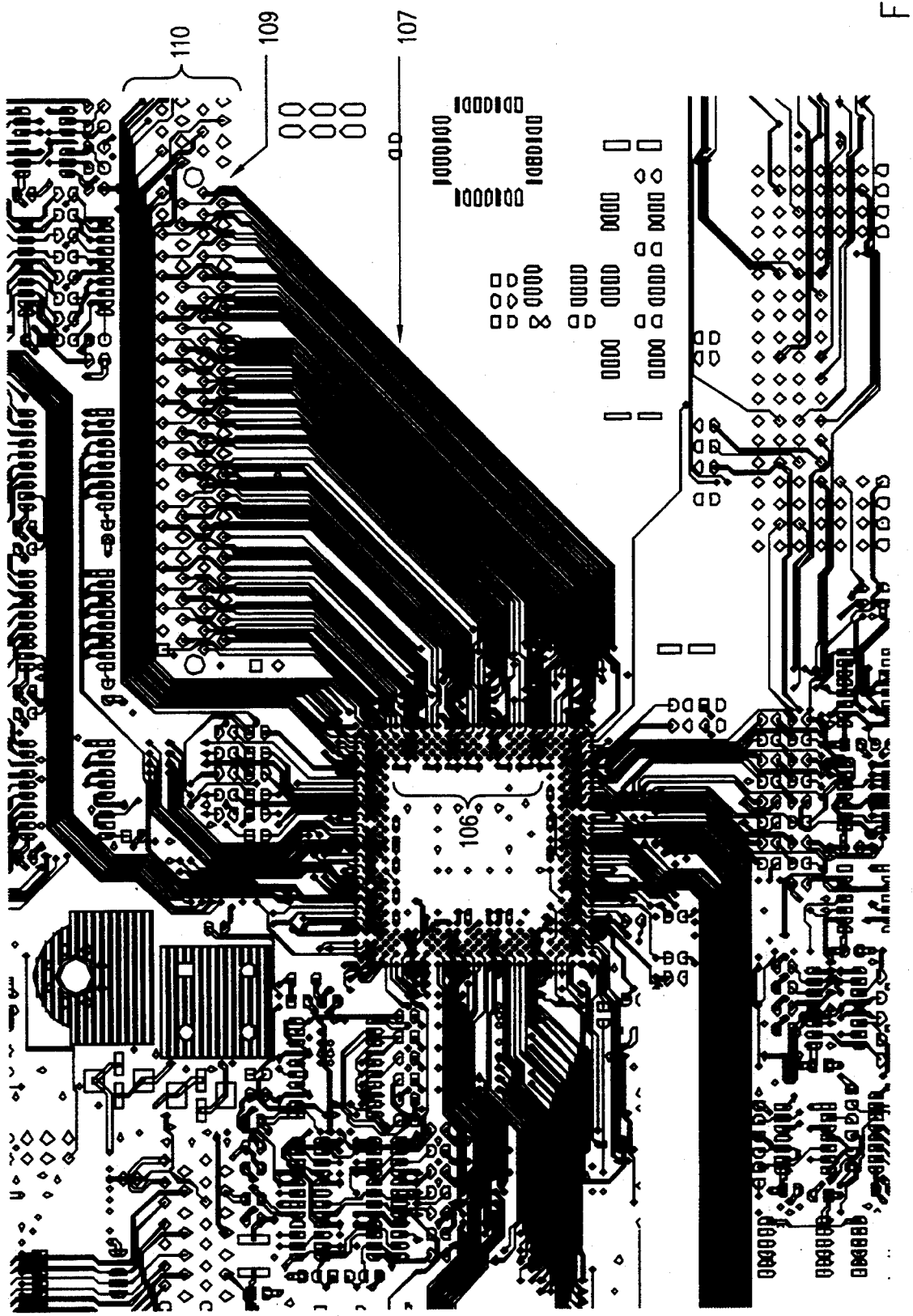
FIG. 5 is a top view of a PCB using a signal routing methodology according to the present invention.
Figure 6:
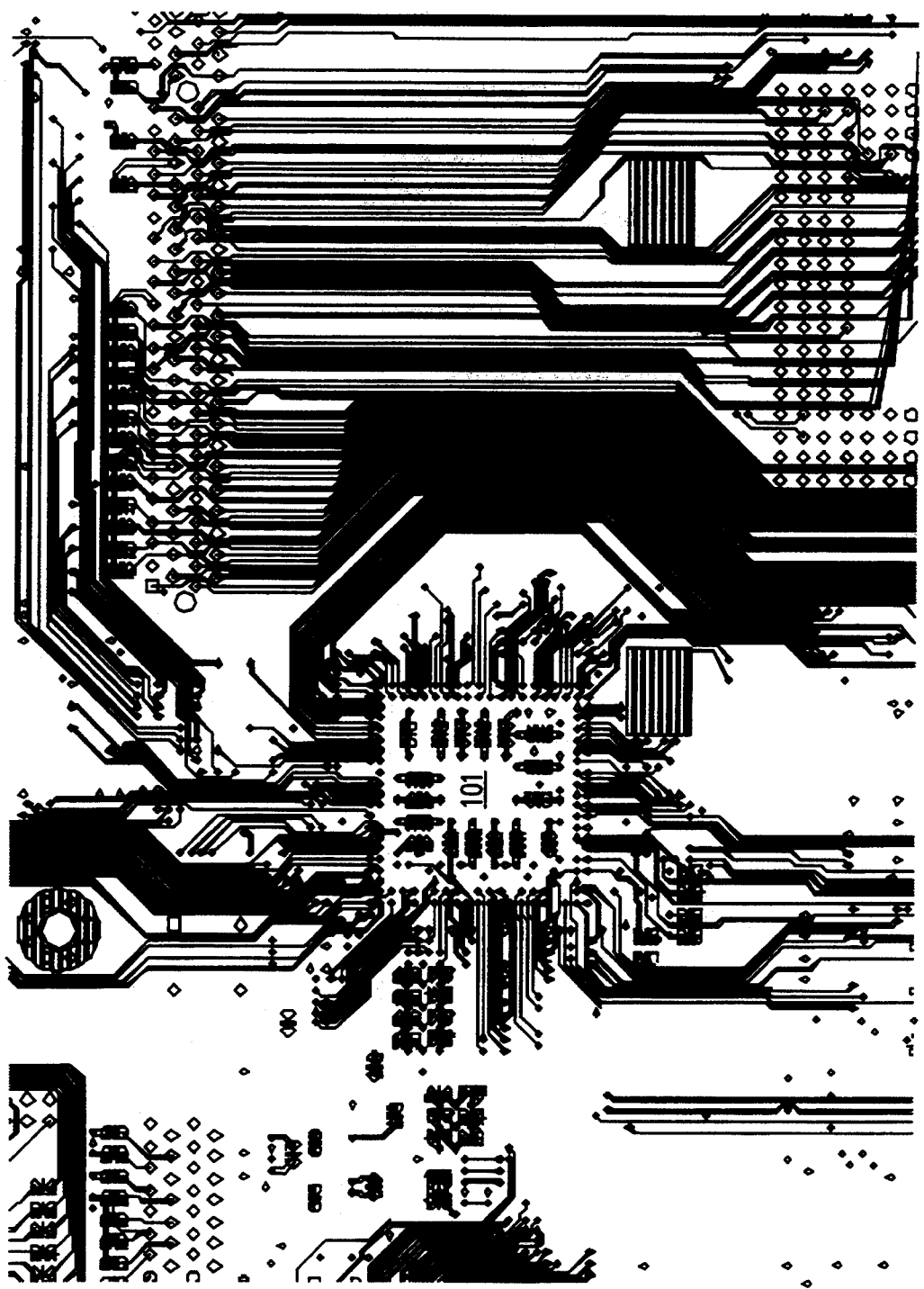
FIG. 6 is a bottom view of the PCB illustrated in FIG. 5.

Referring now to FIGS. 5 and 6, the routing of a double sided printed circuit board using a routing methodology according to the present invention is shown. As shown in FIG. 5, a first plurality of attach pads are routed to areas of low I/O density 110 where the respective vias 109 are located. By locating a number of the vias in an area of low density instead of dropping offset vias immediately proximate to the respective attach pads, a larger amount of the PCB's area is available for signal routing. Thus the PCB can be configured simply as a double sided board, i.e., a two layer board, whereas the prior art method of dropping offset vias for each I/O or attach pad would have required a four layer board to achieve the same signal routing.

A bottom view of the double sided PCB is illustrated in FIG. 6. As shown in FIG. 5, the remaining attach pads which cannot be routed to areas of low density simply include offset vias which appear along the right edge of the mounting pad 101 as shown in FIG. 6.

Figure 7:
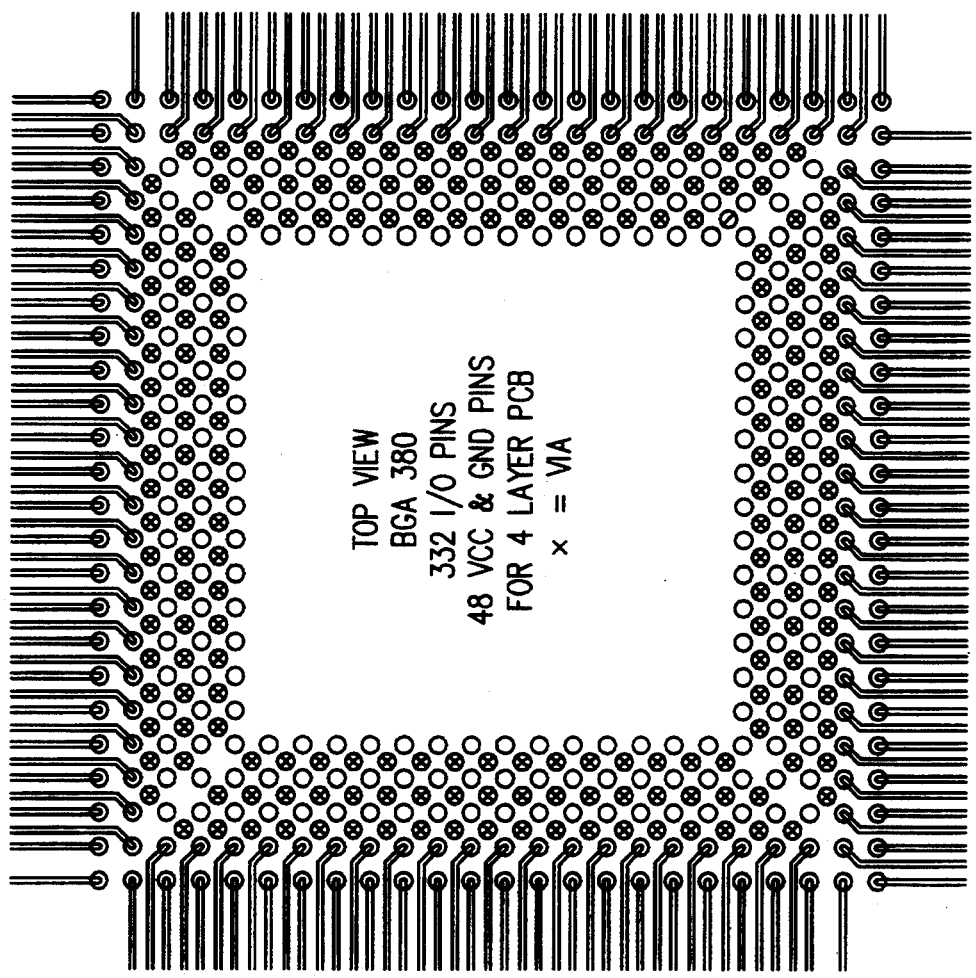
FIG. 7 is a top view of a PCB mounting pad for a high I/O density package using a signal routing methodology according to the present invention.
Figure 8:
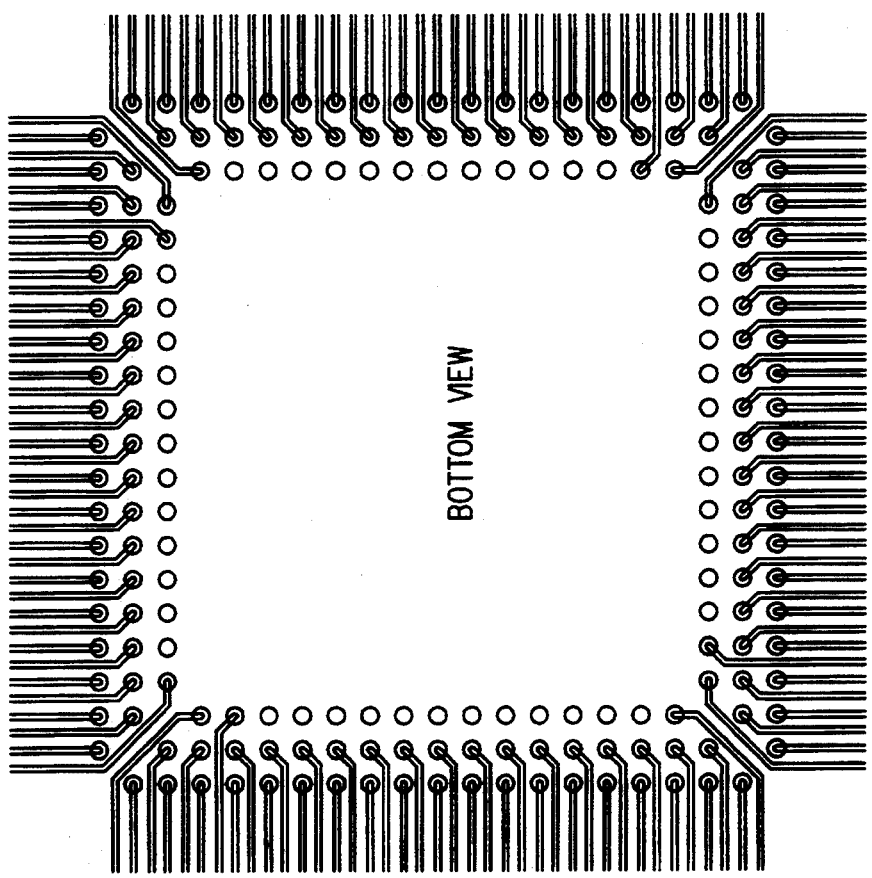
FIG. 8 is a bottom view of the PCB illustrated in FIG. 7.

Referring now to FIGS. 7 and 8, a second example of a PCB mounting pad for a high I/O density package is shown. The PCB illustrated in FIGS. 7 and 8 includes two signal layers as well as power and ground planes. In the routing methodology of the present invention, the power and ground planes are internal to the board, and the signal layers are on the exterior of the board. The addition of separate power and ground planes removes the necessity of providing ground strips between signals as with the PCB in FIGS. 3 and 4, and thus allows for additional signal routing. In the embodiment illustrated in FIGS. 7 and 8, the mounting pad is constructed to receive a ball grid array package with 380 signal I/O pins. The PCB uses a routing methodology according to the present invention which enables this package to be mounted on a four-layer primed circuit board.

As discussed above with regard to FIGS. 3 and 4, a first plurality of the I/O or attach pads are configured as surface mount technology (SMT) pads. Signal lines on the top layer that must connect to other devices on the top layer are simply routed to the other device. Signal lines which must connect to another layer of the PCB are routed to vias which are located outside of the area of local high density, i.e., to low density signal areas. In other words, for as many of the attach pads as possible, the corresponding signals are routed to depopulated areas of the PCB where the via is located. The routing methodology of the present invention allows for the routing of greater than 350 signal I/O pins in a four layer board having only two signal conduction layers.

The present invention further includes a method for constructing a primed circuit board or second level package which includes improved signal routing according to the present invention. This method includes a step of creating one or more mounting pads on the second level package that each include a plurality of connector pads and that is adapted for receiving respective high I/O density devices. The method further includes steps of creating the desired signal traces in the second level package which route from a first plurality of the attach pads on the mounting pad and which route to a low signal density or depopulated area of the circuit board. The method further comprises creating a plurality of vias in the depopulated area of the circuit board which are used to electrically connect the signal traces to other layers in the second level package. Since the manner in which signal traces and vias are created in second level packages, such as printed circuit boards, is well known in the art, details of these steps are omitted for simplicity.

Therefore, an improved routing methodology for high I/O density packages is shown. Although the present invention has been described in conjunction with printed circuit boards, it is noted that the present invention may be utilized with any of the various types of second level packaging. In the present disclosure, the terms "circuit board" or "printed circuit board" are intended to encompass all types of second level packaging. Further, although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A circuit board having an improved routing methodology for high I/O density devices, comprising:
    a first layer including a mounting pad for receiving a high I/O density device, wherein the mounting pad includes a first plurality of attach pads; and
    signal traces corresponding to the first plurality of attach pads which route to a depopulated area of the board, (wherein) said circuit board (includes) further including a plurality of vias situated in the depopulated area of the board, said vias being arranged for connection to selected ones of said signal traces (which connect to said signal traces).

2. The circuit board of claim 1, wherein said first plurality of attach pads are configured as surface mount technology pads.

3. The circuit board of claim 1, wherein said plurality of vias electrically connect to other layers in said circuit board.

4. The circuit board of claim 1, wherein the mounting pad includes a second plurality of attach pads, and wherein the circuit board further includes a plurality of offset vias corresponding to the second plurality of attach pads.

5. The circuit board of claim 1, wherein said circuit board is a double layer board comprising only two signal conductor layers and wherein said mounting pad is adapted for receiving a high I/O density device having greater than 300 I/O pads.

6. The circuit board of claim 1, wherein said circuit board is a four layer board comprising two signal conductor layers, a power plane, and a ground plane, and wherein said mounting pad is adapted for receiving a high I/O density device having greater than 350 I/O pads.

7. The circuit board of claim 1, wherein said mounting pad includes a plurality of voltage pads and wherein said voltage pads are concentrated in one location and include one or more common vias.

8. A method for manufacturing a circuit board with improved signal routing, comprising the steps of:
    creating a mounting pad on a circuit board, wherein said mounting pad includes a first plurality of attach pads and is adapted for receiving a high I/O density device; routing a first plurality of signal traces from the first plurality of attach pads to a depopulated area of the circuit board; and creating a plurality of vias in said depopulated area of the circuit board (which connect); and
    connecting said vias to said first plurality of signal traces.

9. The method of claim 8, wherein said mounting pad includes a second plurality of attach pads, the method further comprising:
    creating a plurality of offset vias associated with the second plurality of attach pads.

10. The method of claim 8, wherein said circuit board is a double layer board comprising only two signal conductor layers, and wherein said mounting pad is adapted for receiving a high I/O density device having greater than 300 I/O pads.

11. The method of claim 8, wherein said circuit board is a four layer board comprising two signal conductor layers, a power plane, and a ground plane, and wherein said mounting pad is adapted for receiving a high I/O density device having greater than 350 I/O pads.

12. A circuit board section having at least first and second surfaces thereof;

- a first grouping of electrically conductive board contact points disposed along said first surface, said first grouping being arranged in a relatively congested area of said first surface having many component connection points arranged for connection to a plurality of electrical components to be mounted on the board, said board further including sparsely populated board areas, said sparsely populated board areas including a plurality of remote connection points;
- a first set of electrically conducting signal lines disposed on said first surface between selected ones of said board contact points and selected corresponding remote connection points on said first surface;
- a set of second surface connection points disposed on said second surface;
- a first set of electrically conducting vias connecting others of said board contact points to selected ones of said second surface connection points; and
- a second set of electrically conducting vias arranged between said first and second surfaces in said sparsely populated board area, said second set of vias being arranged for connecting said remote connection points to connection points on said second surface.

* * * * *

UNITED STATES PATENT AND TRADEMARK OFFICE
CERTIFICATE OF CORRECTION

PATENT NO. : 5,424,492

DATED : June 13, 1995

INVENTOR(S) : Robert B. Petty

It is certified that error appears in the above-identified patent and that said Letters Patent is hereby corrected as shown below:

Column 6, line 15, delete "(wherein)" and "(includes)";

Column 6, line 19, delete "(which connect to said signal traces)";

Column 6, line 55, delete "(which connect)".

Signed and Sealed this

Twenty-fourth Day of October, 1995

Attest:

BRUCE LEHMAN

*Attesting Officer*      *Commissioner of Patents and Trademarks*